United States Patent [19]

Nakamura et al.

[11] Patent Number: 5,703,491
[45] Date of Patent: Dec. 30, 1997

[54] VOLTAGE DETECTION APPARATUS

[75] Inventors: Takuya Nakamura, Hamakita; Isuke Hirano, Hamamatsu; Shinichiro Aoshima, Iwata; Hironori Takahashi, Hamamatsu; Tsuneyuki Urakami, Shuchi-gun, all of Japan

[73] Assignee: Hamamatsu Photonics K.K., Hamamatsu, Japan

[21] Appl. No.: 703,768

[22] Filed: Aug. 27, 1996

Related U.S. Application Data

[62] Division of Ser. No. 618,406, Mar. 19, 1996, Pat. No. 5,583,444, which is a continuation of Ser. No. 186,580, Jan. 26, 1994, abandoned.

[30] Foreign Application Priority Data

Jan. 27, 1993 [JP] Japan .................. 5-11835

[51] Int. Cl.$^6$ ........................... G01R 31/032
[52] U.S. Cl. ................ 324/750; 324/96; 324/752
[58] Field of Search ............... 324/750, 96, 158.1, 324/501, 752

[56] References Cited

U.S. PATENT DOCUMENTS

| | | | |
|---|---|---|---|
| 3,102,201 | 8/1963 | Braunstein et al. | 372/26 |
| 3,305,685 | 2/1967 | Wang | 372/26 |
| 3,327,243 | 6/1967 | Stickley | 372/26 |
| 3,458,703 | 7/1969 | Migitaka | 372/26 |
| 3,461,384 | 8/1969 | Bayati et al. | 324/96 |
| 3,477,041 | 11/1969 | Steele et al. | 372/26 |
| 3,488,586 | 1/1970 | Watrous et al. | 324/96 |
| 3,518,574 | 6/1970 | Rutz | 372/26 |
| 3,614,447 | 10/1971 | Paoli et al. | 372/26 |
| 3,680,001 | 7/1972 | Paoli et al. | 372/26 |
| 4,229,829 | 10/1980 | Grunwald | 359/172 |
| 5,357,585 | 10/1994 | Kumar | 381/183 |

FOREIGN PATENT DOCUMENTS

| | | |
|---|---|---|
| 0284214 | 9/1988 | European Pat. Off. . |
| 2718131 | 11/1978 | Germany . |
| 5156379 | 4/1991 | Japan . |

OTHER PUBLICATIONS

Valdmanis et al., Subpicosecond Electrooptic Sampling: Principles and Applications, IEEe Journal of Quantum, Electronics, vol. QE-22, No. 1, Jan. 1986, pp. 69-78.

Jewell et al., Vertical-Cavity Surface-Emitting Lasers: Design, Growth, Fabrication, Characterization, Journal of Quantum Electronics, vol. 27, No. 6, Jun. 1991, pp. 1332-1346.

Kolner et al., Electrooptic Sampling in GaAs Integrated Circuits, IEEE Journal of Quantum Electronics, vol. QE-22, No. 1, Jan. 1986, pp. 79-93.

Nagatsuma et al., Subpicosecond sampling using a noncontact electro-optic probe, J. Appl. Phys. 66(9), Nov. 1989, pp. 4001-4009.

High Integrated Micro-Laser, Nikkei Science, vol. 1992, Jan., 1992, pp. 74-82.

Probe Measuring Technology and the Application Thereof, Sony Tektronic Inc., Nov. 1991, pp. 22-25.

*Primary Examiner*—Ernest F. Karlsen
*Attorney, Agent, or Firm*—Cushman Darby & Cushman IP Group of Pillsbury Madison & Sutro LLP

[57] ABSTRACT

This invention has as its object to provide a voltage measurement apparatus which has a compact probe unit, and which can perform a measurement in a non-contact manner. The voltage measurement apparatus includes detection means for detecting an electric field generated in a space by a voltage applied to the surface of a device to be measured, light-emitting means for modulating output light by superposing a detected signal obtained from the detection means on a bias current which is supplied to inductively radiate the output light, a constant current source for supplying the bias current to the light-emitting means, extraction means for extracting a signal component of the output light from the light-emitting means, and light-transmission means for guiding the output light from the light-emitting means to the extraction means, and measures the applied voltage to the surface of the device to be measured by bringing the detection means close to the device to be measured in a non-contact manner.

11 Claims, 17 Drawing Sheets

Reference signal

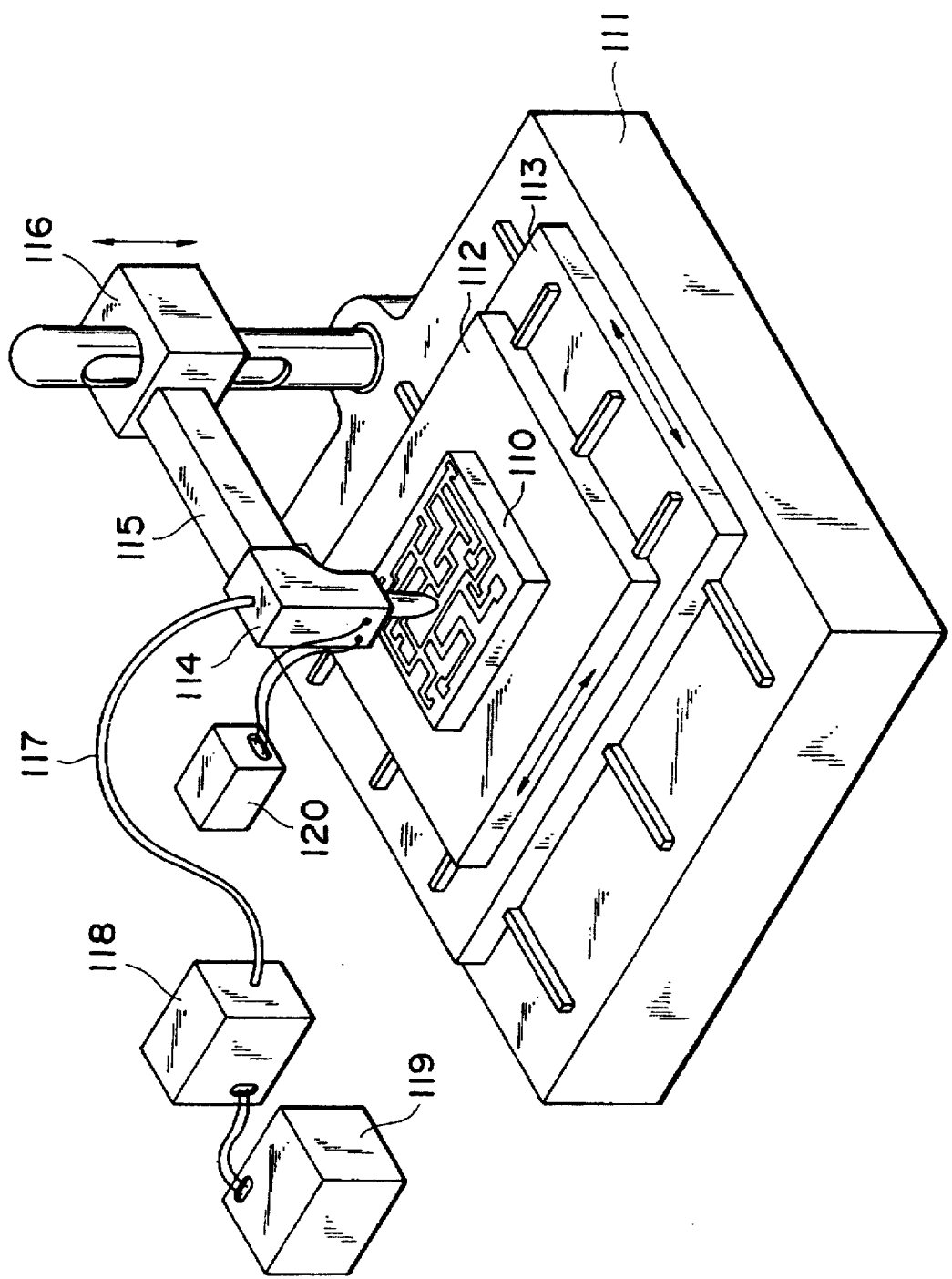

VOLTAGE DETECTION APPARATUS

This is a division of application No. 08/618,406, filed Mar. 19, 1996, now U.S. Pat. No. 5,583,444 which is a Continuation of application No. 08/186,580, filed Jan. 26, 1994 now abandoned.

BACKGROUND OF THE INVENTION

1. Field of the Invention

The present invention relates to a voltage measurement device for detecting a very low voltage applied to a local portion of a device to be measured.

2. Related Background Art

As conventional methods for measuring a very low voltage signal applied to a local portion of a device to be measured, the first method for measuring a voltage signal by contacting a probe of an oscilloscope to an electrical circuit to be measured, the second method for optically measuring a voltage signal using an E-O probe consisting of an electro-optic crystal, and the like are known. As an example of the second measurement method, a method disclosed in Japanese Patent Laid-Open No. 156379/1991 is known. This reference discloses a technique for detecting an electrical signal applied to an electrical circuit to be measured without bringing the E-O probe into contact with a device to be measured.

However, in the first measurement method, since a measurement is performed by bringing the probe into direct contact with an electrical circuit to be measured, the constant of the electrical circuit undesirably changes. Furthermore, a signal waveform upon transmission is distorted due to the distributed constant of a transmission line for connecting the probe and a main body, or external noise is superposed on an electrical signal on the transmission line, thus deteriorating the S/N ratio. Owing to these problems, it is difficult to measure a true electrical signal by the measurement method using the oscilloscope.

It is difficult to measure a plurality of points at the same time by the second measurement method. Furthermore, due to a very small electro-optic crystal, and a large number of optical elements, it is difficult to align the optical elements.

SUMMARY OF THE INVENTION

In order to solve the above-mentioned problems, a voltage detection apparatus according to the first aspect of this comprises: detection means for detecting the strength of an electric field generated in a space by a voltage applied to the surface of a device to be measured; light-emitting means for modulating output light with a signal detected by the detection means; and extraction means for extracting a signal component of the output light from the light-emitting means.

The detection means may comprise a metal electrode having a rod shape with a sharp distal end, or a dipole shape, or may comprise a needle-shaped metal electrode inserted in a hollow tube consisting of a non-conductive material. Furthermore, light-transmission means for guiding the output light from the light-emitting means to the extraction means may be arranged.

Since the voltage detection apparatus according to the first aspect of this has the above-mentioned arrangement, when the detection means is brought close to the surface of a device to be measured, an electric field generated in a space by a voltage applied to the surface of the device to be measured is detected by the detection means as a detected signal corresponding to the electric field strength. The detected signal is supplied to the light-emitting means to modulate output light. When a signal component of the modulated output light is extracted by the extraction means, the voltage applied to the surface of the device to be measured can be detected.

In this case, when the detection means comprises a rod-shaped metal electrode with a sharp distal end or a needle-shaped metal electrode inserted in a hollow tube, a voltage signal on a very small circuit such as an IC circuit, which is difficult to observe by human eyes, can be easily detected. When the detection means comprises a dipole-shaped metal electrode, a voltage signal on an elongated device to be measured such as a metal wiring pattern can be detected with high sensitivity.

In this manner, since the applied voltage is detected without contacting the detection means with the device surface, the applied voltage on the surface of the device to be measured can be prevented from being distorted, or superposition of noise can be prevented. For this reason, a voltage applied to the surface of the device to be measured can be precisely detected.

Since the detection means and the light-emitting means can be easily integrated, the apparatus can be rendered compact. Furthermore, since the light-emitting means outputs an optical signal, and simultaneously modulates the optical signal, the number of optical elements can be decreased as compared to a conventional voltage detection apparatus which performs outputting and modulation of an optical signal using different optical elements. For this reason, alignment between, e.g., the optical axes of optical elements is facilitated, and the apparatus can be stabilized.

When the light-transmission means is arranged between the light-emitting means and the extraction means, a probe unit consisting of the detection means and the light-emitting means, and the extraction means can be separated away from each other, and waveform distortion or mixing of external noise during transmission can be suppressed as much as possible. If the light-transmission means comprises an optical fiber, the probe unit and the extraction means can be freely arranged.

A voltage detection apparatus according to the second aspect of this comprises: a semiconductor laser for detecting the strength of an electric field generated in a space by a voltage applied to the surface of a device to be measured by bringing a lower-surface electrode close to the surface of the device to be measured, and modulating output light with the detected signal; a constant current source for supplying a bias current to the semiconductor laser; extraction means for extracting a signal component of the output light from the semiconductor laser; and light-transmission means for guiding the output light from the semiconductor laser to the extraction means.

Since the voltage detection apparatus according to the second aspect of this has the above-mentioned arrangement, when the lower-surface electrode of the semiconductor laser is brought close to the surface of a device to be measured, an electric field generated in a space by a voltage applied to the surface of the device to be measured is detected by the lower-surface electrode as a detected signal corresponding to the electric field strength. This detected signal is superposed on the bias current supplied from the constant current source to the semiconductor laser. Upon superposition of the detected signal, output light inductively radiated from the semiconductor laser is modulated. When light is inductively radiated from the semiconductor laser, the output light intensity is proportional to the supplied current, and the ratio between the light and the current is constant. For this reason, in this semiconductor laser, the output light intensity increases/decreases in correspondence with the detected signal supplied upon being superposed on the bias current.

When a signal component of the modulated output light is extracted by the extraction means, a voltage applied to the surface of the device to be measured can be detected.

In this manner, since the applied voltage is detected without contacting the lower-surface electrode of the semiconductor laser, the applied voltage on the surface of the device to be measured can be prevented from being distorted, or superposition of noise can be prevented. For this reason, a voltage applied to the surface of the device to be measured can be precisely detected.

Furthermore, since the semiconductor laser outputs an optical signal, and simultaneously modulates the optical signal, the number of optical elements can be decreased as compared to a conventional voltage detection apparatus which performs outputting and modulation of an optical signal using different optical elements. For this reason, alignment between, e.g., the optical axes of optical elements is facilitated, and the apparatus can be stabilized.

When the light-transmission means is arranged between the semiconductor laser and the extraction means, the semiconductor laser and the extraction means can be separated away from each other, and waveform distortion or mixing of external noise during transmission can be suppressed as much as possible. If the light-transmission means comprises an optical fiber, the semiconductor laser and the extraction means can be freely arranged.

Furthermore, a voltage detection apparatus according to the third aspect of this comprises: a plurality of two-dimensionally arranged detection electrodes each for detecting the strength of an electric field generated in a space by a voltage applied to the surface of a device to be measured; a semiconductor laser array, consisting of a plurality of semiconductor lasers corresponding to the detection electrodes, for modulating output light beams by superposing detected signals from the plurality of detection electrodes on a bias current which is supplied to inductively radiate output light beams; a constant current source for supplying a bias current to the semiconductor laser array; extraction means for extracting signal components of the output light beams from the semiconductor lasers of the semiconductor laser array; and light-transmission means for guiding the output light beams from the semiconductor laser array to the extraction means.

Since the voltage detection apparatus according to the third aspect of this has the above-mentioned arrangement, when the plurality of two-dimensionally arranged detection electrodes are brought close to the surface of a device to be measured, an electric field generated in a space by a voltage applied to the surface of the device to be measured is detected by the detection electrodes as detected signals corresponding to the electric field strength. These detected signals are supplied to the corresponding semiconductor lasers of the semiconductor laser array, and are superposed on the bias current supplied from the constant current source to the semiconductor lasers. Upon superposition of the detected signals, output light beams to be inductively radiated from each semiconductor laser are modulated.

When the signal components of the modulated output light beams are extracted by the extraction means, a voltage signal on the device to be measured can be two-dimensionally detected, and the distribution of a voltage applied to the surface of the device to be measured can be detected.

When the light-transmission means is arranged between the semiconductor laser array and the extraction means, probe units consisting of the plurality of detection electrodes and the semiconductor laser array, and the extraction means can be separated away from each other, and waveform distortion or mixing of external noise during transmission can be suppressed as much as possible. If the light-transmission means comprises an optical fiber array, the probe units and the extraction means can be freely arranged.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 20 is a perspective view showing an application using the embodiment of the present invention in an IC inspection apparatus.

DESCRIPTION OF THE PREFERRED EMBODIMENTS

Figure 1:
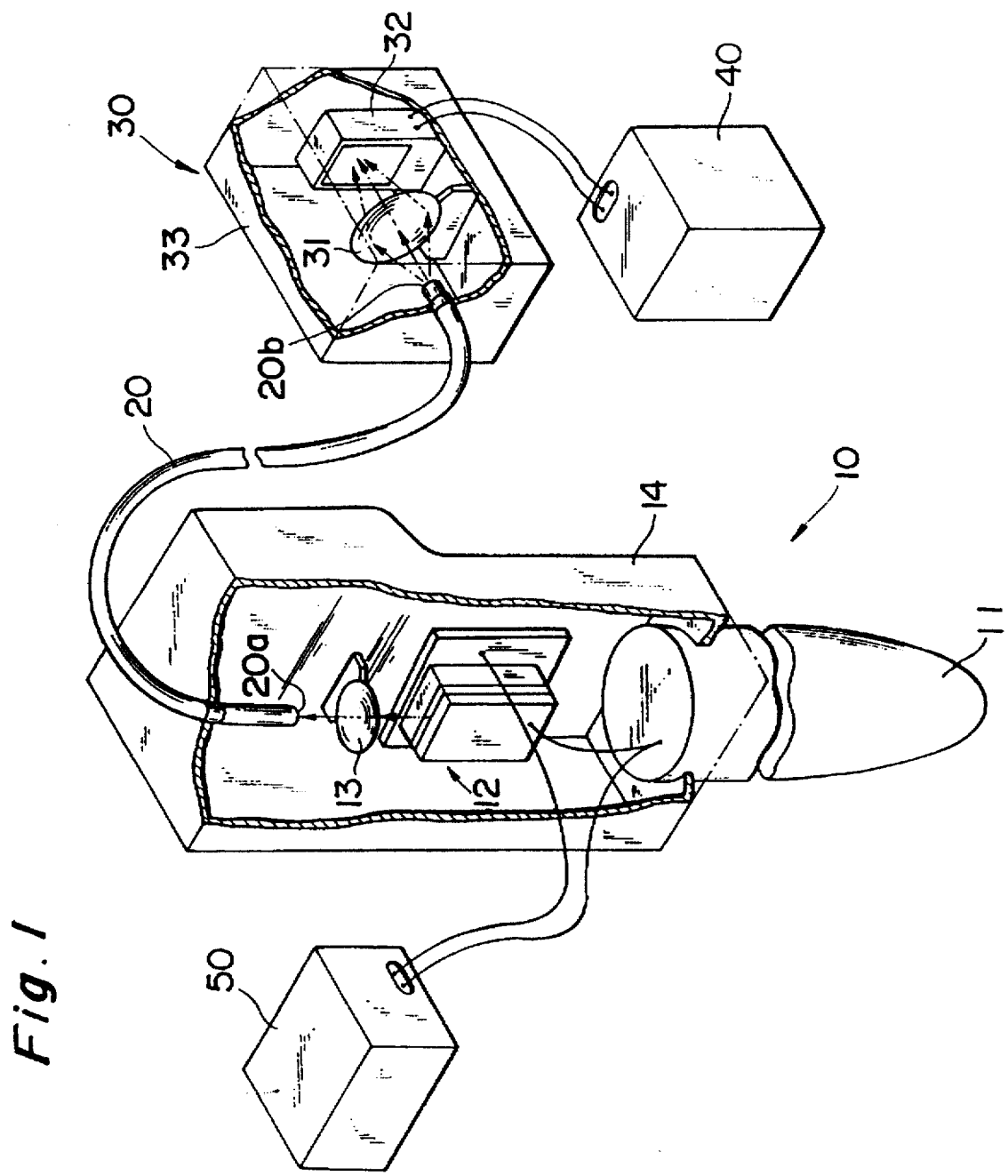
FIG. 1 is a perspective view showing the structure of a voltage detection apparatus according to an embodiment of the present invention.

An embodiment of the present invention will be described below with reference to the accompanying drawings. FIG. 1 is a perspective view showing the structure of a voltage detection apparatus according to this embodiment. The voltage detection apparatus of this embodiment comprises a probe unit 10 for detecting the electric field strength of a device surface upon being brought close to the surface of a device to be measured, and outputting the electric field strength as an optical signal, an optical fiber 20 for transmitting an optical signal output from the probe unit 10, and a photodetector 30 for converting the optical signal output from the probe unit 10 into an electrical signal. The apparatus also comprises a signal processor 40 for extracting a signal component included in the electrical signal converted by the photodetector 30, and a constant current source 50 for supplying a current to the probe unit 10.

The probe unit 10 comprises an electrode 11 for detecting the strength of an electric field generated in a space by a voltage signal on the surface of a device to be measured, a semiconductor laser 12 for modulating output light in correspondence with the electrical signal generated by the electric field strength detected by the electrode 11, and a focusing lens 13 for focusing light output from the semiconductor laser 12 at an input terminal 20a of the optical fiber 20. The photodetector 30 comprises a focusing lens 31 for focusing output light from the optical fiber 20, and a photoelectric conversion element 32 for converting an optical signal focused by the focusing lens 31 into an electrical signal. The focusing lens 31 and the photoelectric conversion element 32 are stored in an air-tight package 33.

In this embodiment, the electrode 11 adopts a rod-shaped electrode with a sharp distal end, and the semiconductor laser 12 and the focusing lens 13 are packaged in an air-tight package 14. The air-tight package 14 is manufactured using an insulating material. With this package, deterioration of the semiconductor laser 12 can be prevented, and optical axis adjustment can be simplified, thus improving reliability.

The operation of this embodiment is as follows. Upon current supply from the current source 50, a bias current flows through the semiconductor laser 12, and a laser beam is inductively radiated. The output light is focused by the focusing lens 13, and is supplied to the input terminal 20a of the optical fiber 20. The light supplied to the input terminal 20a is transmitted through the interior of the optical fiber 20, emerges from an output terminal 20b, and is focused on the input surface of the photoelectric conversion element 32 by the focusing lens 31.

When the distal end of the electrode 11 is brought close to a device to be measured, a current flows through the electrode 11 by an electric field on the surface of the device to be measured. Since this current is superposed on a bias current supplied from the current source 50, the output light inductively radiated from the semiconductor laser 12 is modulated. When the laser beam is inductively radiated from the semiconductor laser 12, the intensity of the output light is proportional to the supplied current, and the ratio between the intensity and the current is constant. For this reason, the intensity of the output light from the semiconductor laser 12 increases/decreases in correspondence with the detected signal supplied upon being superposed on the bias current. The modulated output light is focused on the photoelectric conversion element 32, and is converted into an electrical signal, thereby detecting a voltage applied to the surface of the device to be measured.

Figure 2:
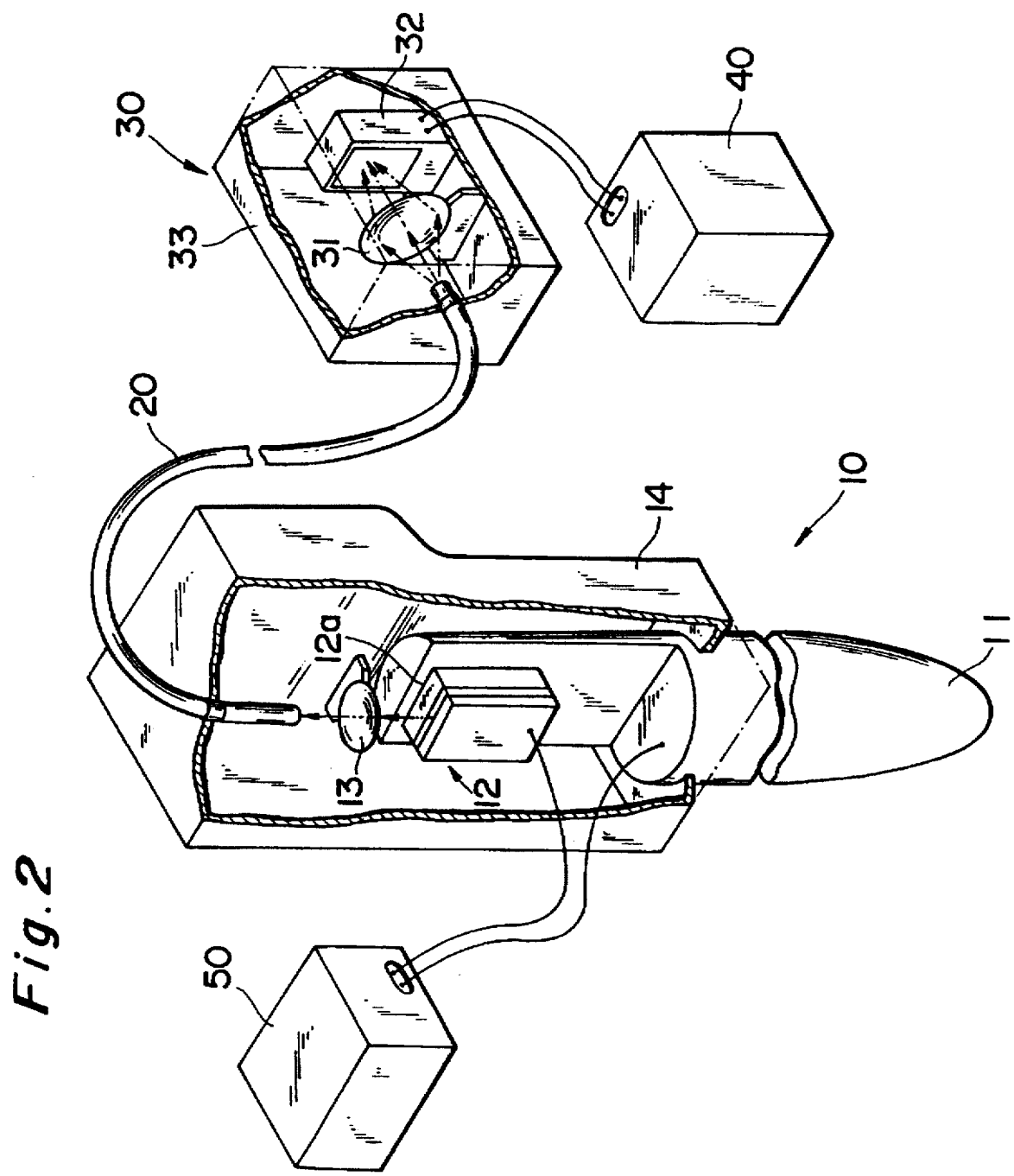
FIG. 2 is a perspective view showing after structure of the voltage detection apparatus according to the embodiment of the present invention.

FIG. 2 is a perspective view showing a modification of this embodiment. A difference between this modification and the embodiment shown in FIG. 1 is that the proximal end portion of the rod-shaped electrode 11 with a sharp distal end is ground to form a flat portion, and the semiconductor laser 12 is arranged on this flat portion to achieve a further compact structure. Since the semiconductor laser 12 contacts the flat portion, so that its lower-surface electrode 12a is electrically connected to the electrode 11, a transmission line for connecting the electrode 11 and the lower-surface electrode 12a of the semiconductor laser 12 can be omitted. For this reason, a signal distortion and mixing of external noise during transmission can be suppressed as much as possible. The reason why the semiconductor laser 12 can be arranged on the electrode 11 is that one side of the chip of the semiconductor laser 12 is as small as 300 µm.

In the embodiments shown in FIGS. 1 and 2, since the rod-shaped electrode 11 with a sharp distal end is used, only an electric field in a narrow portion of the surface of the device to be measured to the vicinity of which the electrode 11 is brought for measurement is coupled. For this reason, the coupling efficiency becomes low, but the spatial resolution can be improved. In these embodiments, the optical fiber 20 is used as light-transmission means for guiding output light from the semiconductor laser 12 to the photodetector 30. For this reason, the probe unit 10 and the photodetector 30 can be separated away from each other. Also, a problem associated with disturbance of an electric field on the surface of the device to be measured caused by a metal transmission line can be avoided.

Figure 3:
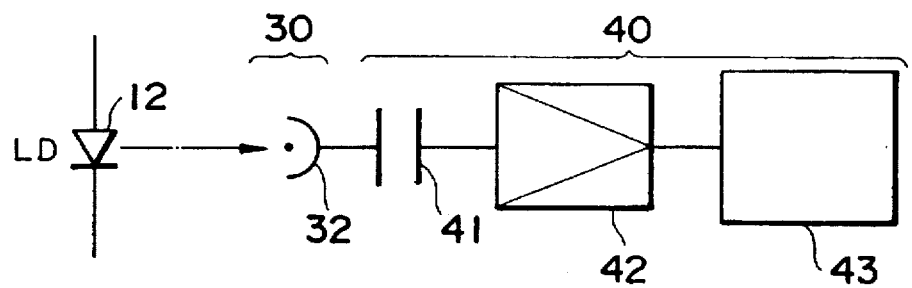
FIG. 3 is a plan view showing an arrangement of a signal processor.
Figure 4:
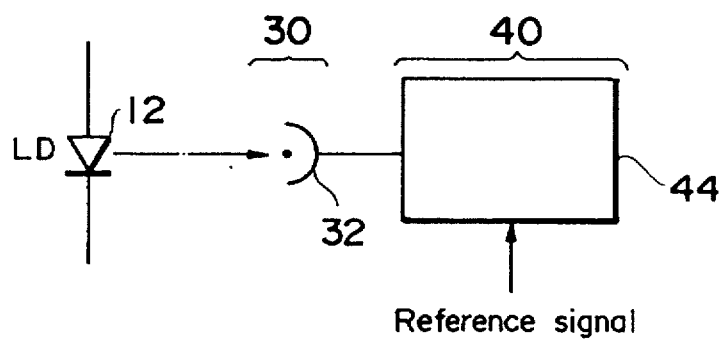
FIG. 4 is a plan view showing another arrangement of the signal processor.

The arrangement of the signal processor 40 will be described below with reference to the plan views in FIGS. 3 and 4. Output light from the semiconductor laser 12 is photoelectrically converted by the photoelectric conversion element 32 such as a photodiode to obtain a modulated electrical signal. The modulated electrical signal is supplied to the signal processor 40, and a signal component superposed on a DC component is detected. More specifically, the modulated electrical signal is separated by capacitance coupling using a capacitor 41. As shown in FIG. 3, the separated signal is amplified by an amplifier 42, and is measured using an oscilloscope 43. Alternatively, as shown in FIG. 4, the signal may be measured using a lock-in amplifier 44. Furthermore, for example, if an accumulation is performed using a storage oscilloscope to increase the S/N ratio, detection precision can be improved.

Figure 5:
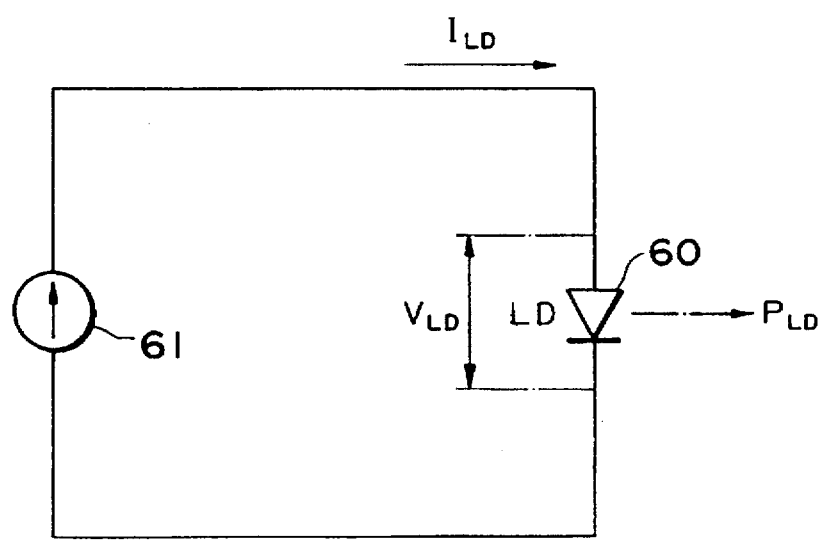
FIG. 5 is a circuit diagram showing the relationship between the applied voltage and the output light intensity of a semiconductor laser.
Figure 6:
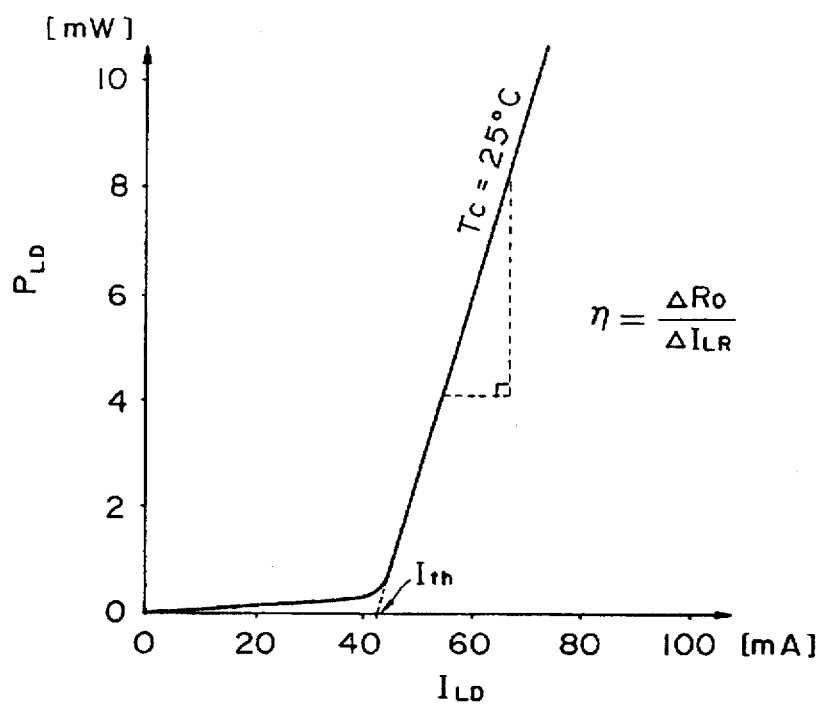
FIG. 6 is a graph showing the relationship between the output light intensity and the injection current.
Figure 7:
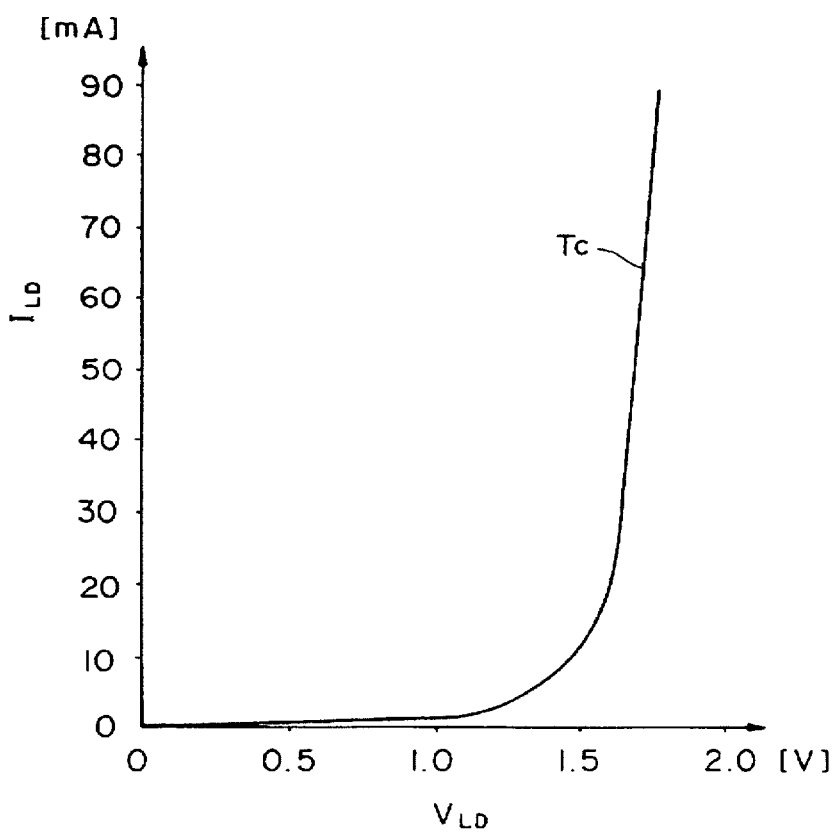
FIG. 7 is a graph showing the relationship between the applied voltage and the injection current.

The operation principle of this embodiment will be described below with reference to FIGS. 5 to 12. FIG. 5 is a circuit diagram showing the relationship between an applied voltage $V_{LD}$ to a semiconductor laser 60, and an output light intensity $P_{LD}$ from the semiconductor laser 60. When an injection current $I_{LD}$ is increased by adjusting a current source 61 in this circuit, since the semiconductor laser 60 laser-oscillates when the current exceeds a threshold current $I_{th}$, the output light intensity $P_{LD}$ from the semiconductor laser 60 immediately increases. FIG. 6 shows the relationship between the output light intensity $P_{LD}$ and the injection current $I_{LD}$. As can be seen from FIG. 6, a constant slope efficiency $\eta(=\Delta P_{LD}/\Delta I_{LD})$ is obtained after laser oscillation. Also, FIG. 7 shows the relationship between the applied voltage $V_{LD}$ and the injection current $I_{LD}$ of the semiconductor laser 60. As can be seen from FIG. 7, even if the injection current $I_{LD}$ increases, the voltage $V_{LD}$ does not change so much. Also, as can be seen from FIG. 7, the inclination $(\Delta I_{LD}/\Delta V_{LD})$ between the injection current $I_{LD}$ and the voltage $V_{LD}$ is almost constant. This is because a pn junction portion of the semiconductor laser 60 serves as a diode. Normally, a current $I_{LD}$ at which the inclination between the voltage $V_{LD}$ and the current $I_{LD}$ begins to become constant satisfies $<<I_{th}$. Therefore, when the current $I_{LD}$ is equal to or higher than the current $I_{th}$, the voltage change amount $\Delta V_{LD}$ is proportional to the current change amount $\Delta I_{LD}$. For this reason, the change amount $\Delta P_{LD}$ of the output light intensity and the change amount $\Delta V_{LD}$ of the applied voltage have a proportional relationship therebetween. With this relationship, the output light can be modified by a change in applied voltage to the semiconductor laser 60.

Figure 8:
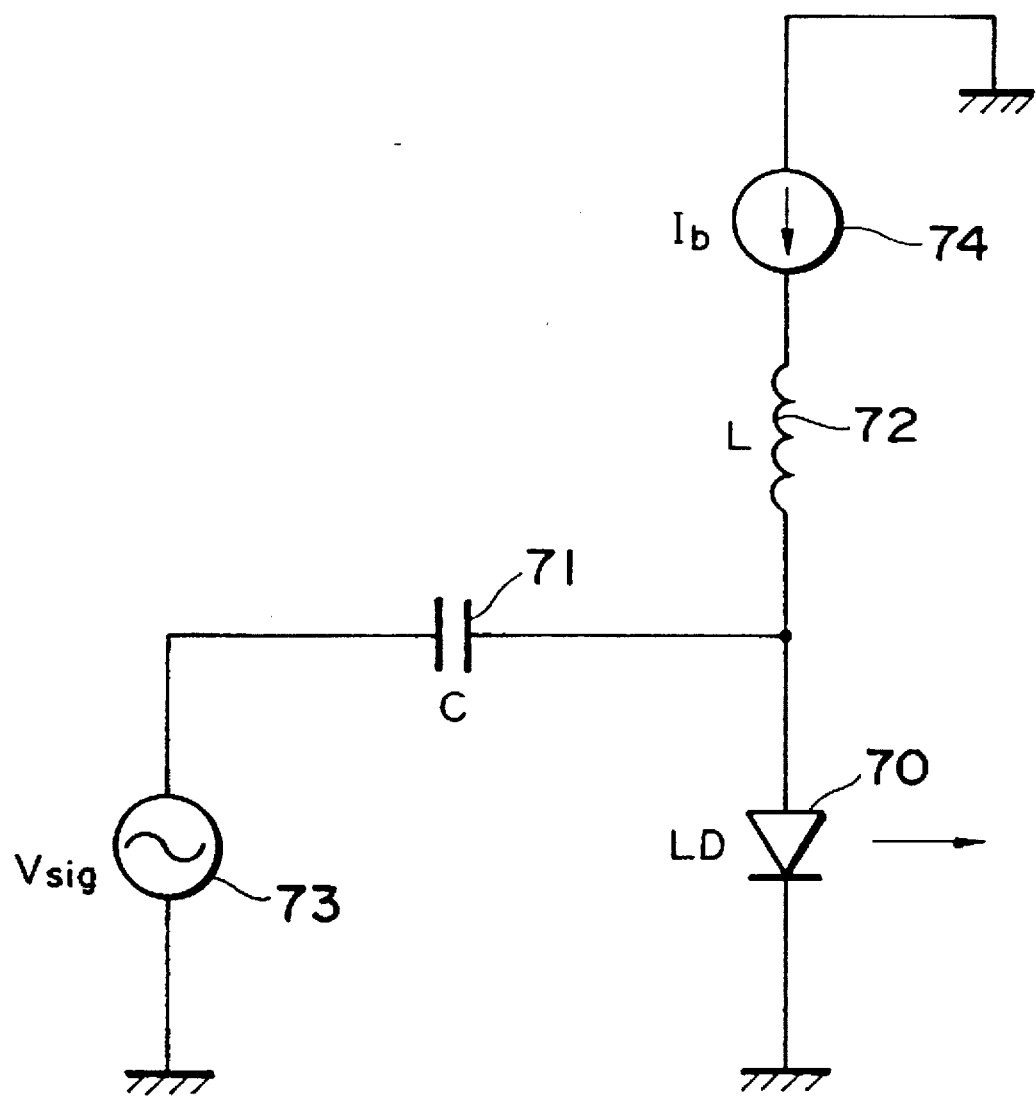
FIG. 8 is a circuit diagram of a voltage detection circuit by modulating a semiconductor laser by superposing an input signal voltage.

In this manner, by utilizing the principle of modulating the output light by a change in applied voltage to the semiconductor laser 60, an input signal voltage $V_{sig}$ of a device to be measured can be measured. More specifically, using a circuit shown in FIG. 8, the input signal voltage $V_{sig}$ of the device to be measured can be superposed on a bias current $I_b$ by the capacitance coupling, and the output light from a semiconductor laser 70 is modulated by a change in voltage of the input signal voltage $V_{sig}$. A more general circuit of the circuit shown in FIG. 8 is the one shown in FIG. 9. In this circuit, an electrode 75 is arranged between a capacitor 71 and an input signal source 73, and when this electrode 75 is brought into contact with a measurement point 76a of a circuit 76 to be measured, an input signal at the measurement point 76a is superposed on the bias current $I_b$. Upon superposition of this input signal, the output light from the semiconductor laser 70 is modulated. When the modulated output light is measured, an electrical signal at the measurement point 76a can be measured.

Figure 9:
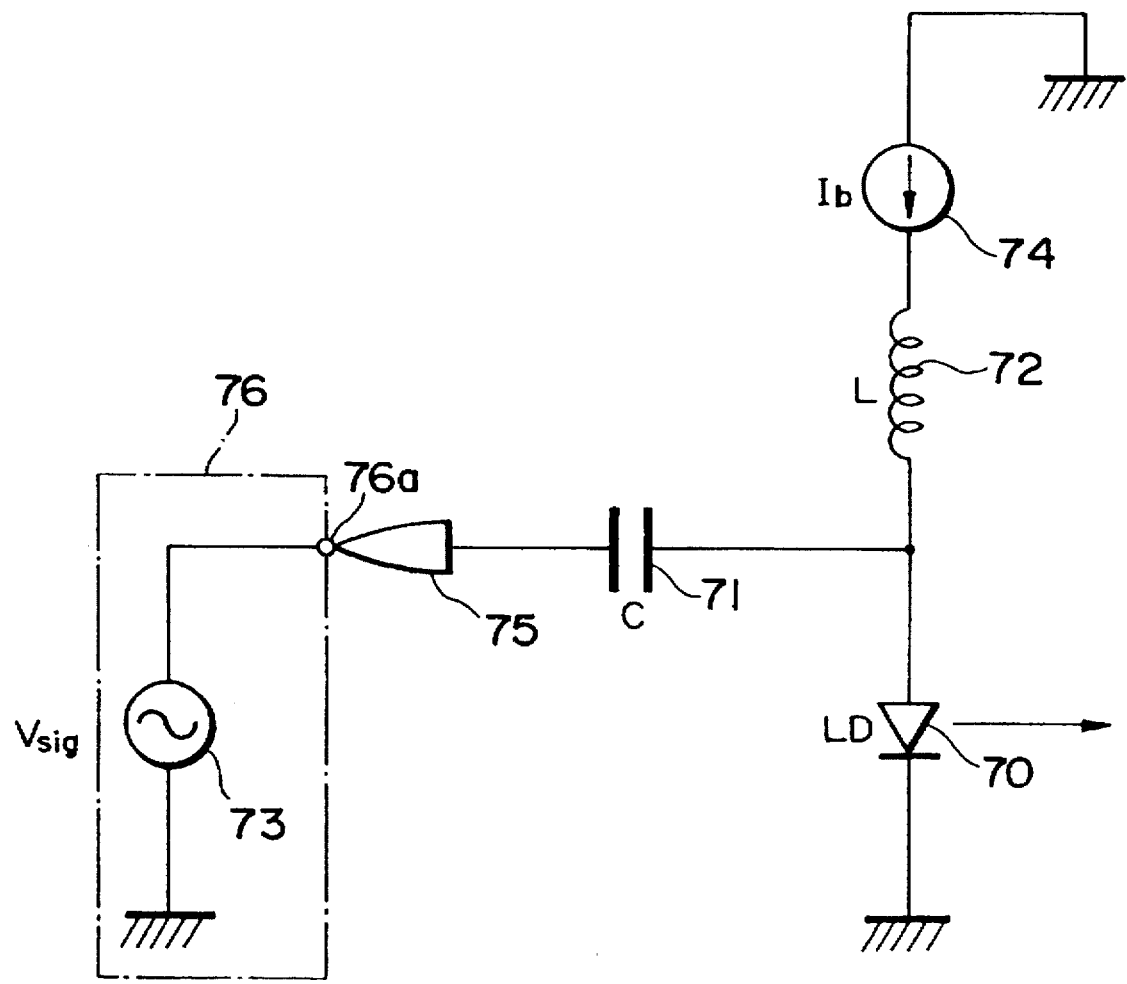
FIG. 9 is a circuit diagram of a voltage detection circuit provided with an electrode for measuring an input signal voltage.

However, when the electrode 75 is brought into direct contact with the measurement point 76a of the circuit 76 to be measured as in the circuit shown in FIG. 9, the circuit constants of the semiconductor laser 70, the electrode 75, and the like influence the circuit 76 to be measured, and the characteristic of the circuit 76 to be measured undesirably changes. For this reason, an electrical signal of the circuit 76 to be measured is distorted, and is measured in a characteristic different from an actual state. In order to suppress such influence on the circuit 76 to be measured, and to measure a correct electrical signal, a measurement must be performed while the electrode 75 and the circuit 76 to be measured are kept in a non-contact state.

Figure 10:
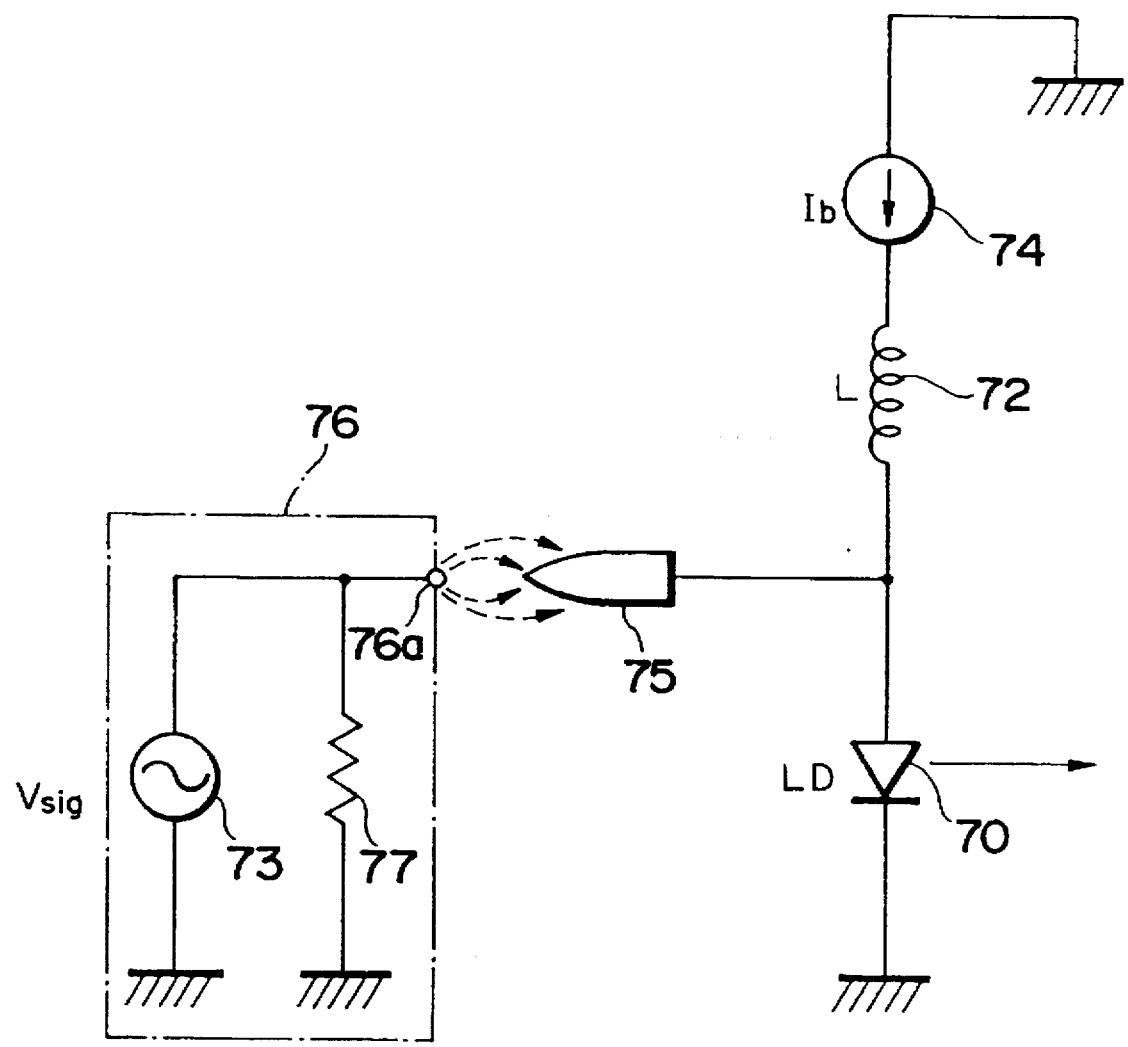
FIG. 10 is a circuit diagram of a voltage detection circuit when an electrode for measuring an input signal voltage is brought into contact with a device to be measured in a non-contact manner.

Thus, this embodiment adopts a method wherein the electrode 75 is brought close to the circuit 76 to be measured in a non-contact state to measure an electrical signal of the circuit 76 to be measured. FIG. 10 is a circuit diagram of this circuit. As the circuit 76 to be measured, an input signal source 73 and a resistor 77 are used. In this circuit, the measurement point 76a of the circuit 76 to be measured is capacitively coupled to the electrode 75, and if their coupling efficiency is represented by $\alpha$, a voltage change amount $\Delta V_{sig}$ at the measurement point 76a of the circuit 76 to be measured is applied to the semiconductor laser 70 as a voltage change amount $\Delta V_{LD} = \alpha \cdot \Delta V_{sig}$. This change in applied voltage modulates the output light from the semiconductor laser 70. When the output light from the semiconductor laser 70 is measured, and the coupling efficiency $\alpha$ is calculated, an electrical signal of the circuit 76 to be measured can be detected.

Figure 11:
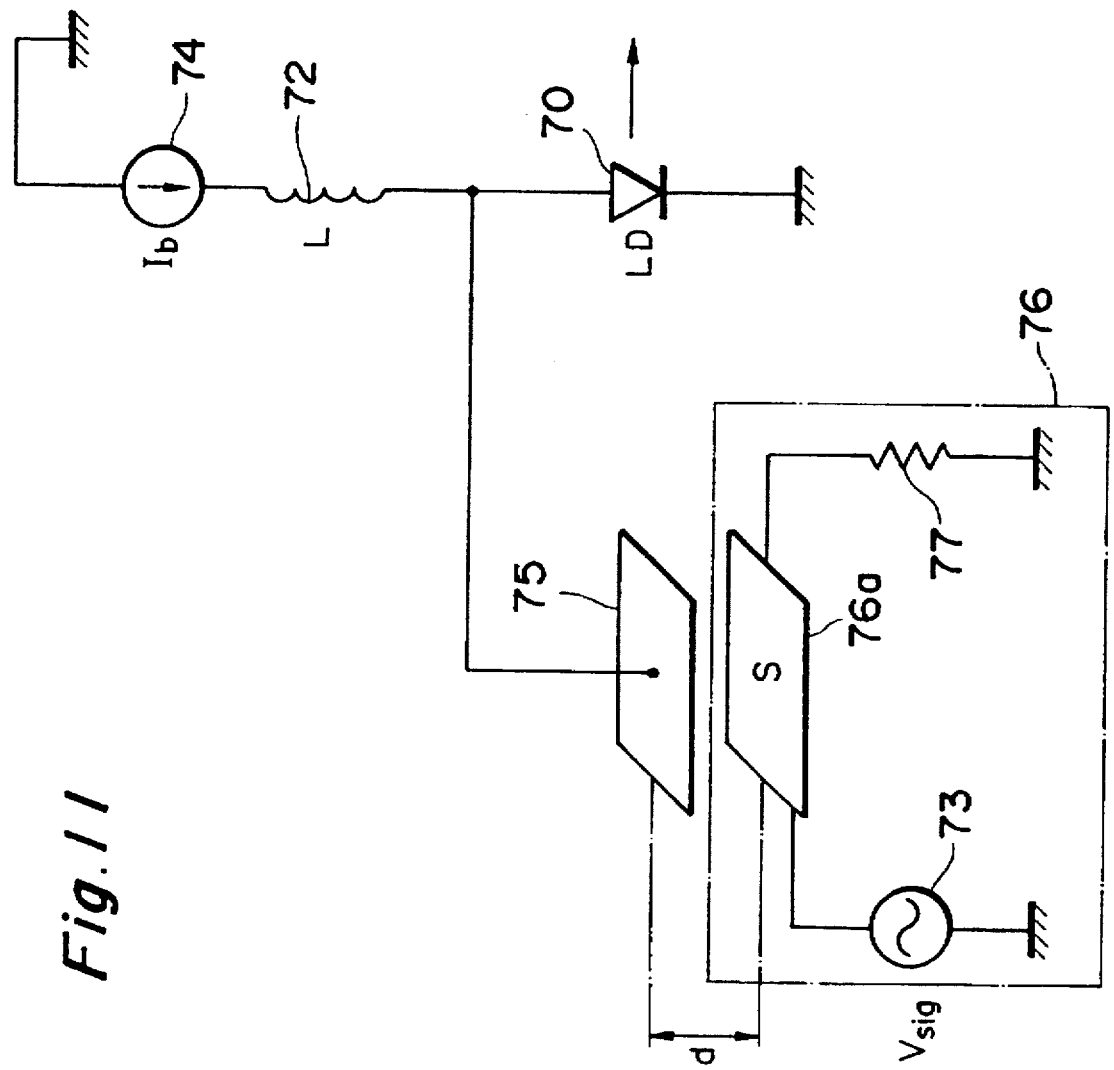
FIG. 11 is a circuit diagram of a voltage detection circuit when an electrode for measuring an input signal voltage comprises parallel plates.

FIG. 11 is a circuit diagram when parallel plates are used as the electrode 75 and the measurement point 76a of the circuit 76 to be measured. If the coupling area is represented by S, and the interval between the electrode 75 and the measurement point 76a is represented by d, an electrostatic capacitance C between the electrode 75 and the measurement point 76a is given by:

$$C = \varepsilon S/d$$

where $\varepsilon$ is the dielectric constant. If the angular frequency of the input signal source 73 is represented by $\omega$, the impedance Z of the electrostatic capacitance C is given by:

$$Z = 1/\omega C$$

Since both the current and voltage of the semiconductor laser 70 linearly change beyond the threshold current $I_{th}$, the semiconductor laser 70 can be replaced by an equivalent resistance R $(=\Delta V_{LD}/\Delta I_{LD})$. Therefore, $V_{LD}$ is given by:

$$V_{LD} = R/(Z+R) \cdot V_{sig}$$

From this equation, we have:

$$\alpha = V_{LD}/V_{sig} = R/(Z+R)$$

Normally, since $Z >> R$, then:

$$\alpha = R/Z$$

The above-mentioned equations yield:

$$\alpha = \omega SR/d$$

For example, if the input signal frequency f=100 kHz, the coupling area S=1.0 mm², the interval d=0.1 mm, and the equivalent resistance R=5 Ω, we have:

$$\begin{aligned}\alpha &= 8.85 \times 10^{-12} \times 2\pi \times 100 \times 10^3 \times 1.0 \times 5/0.1 \\ &= 2.8 \times 10^{-7}\end{aligned}$$

For $\varepsilon = 8.85 \times 10^{-12}$ F/m.

Figure 12:
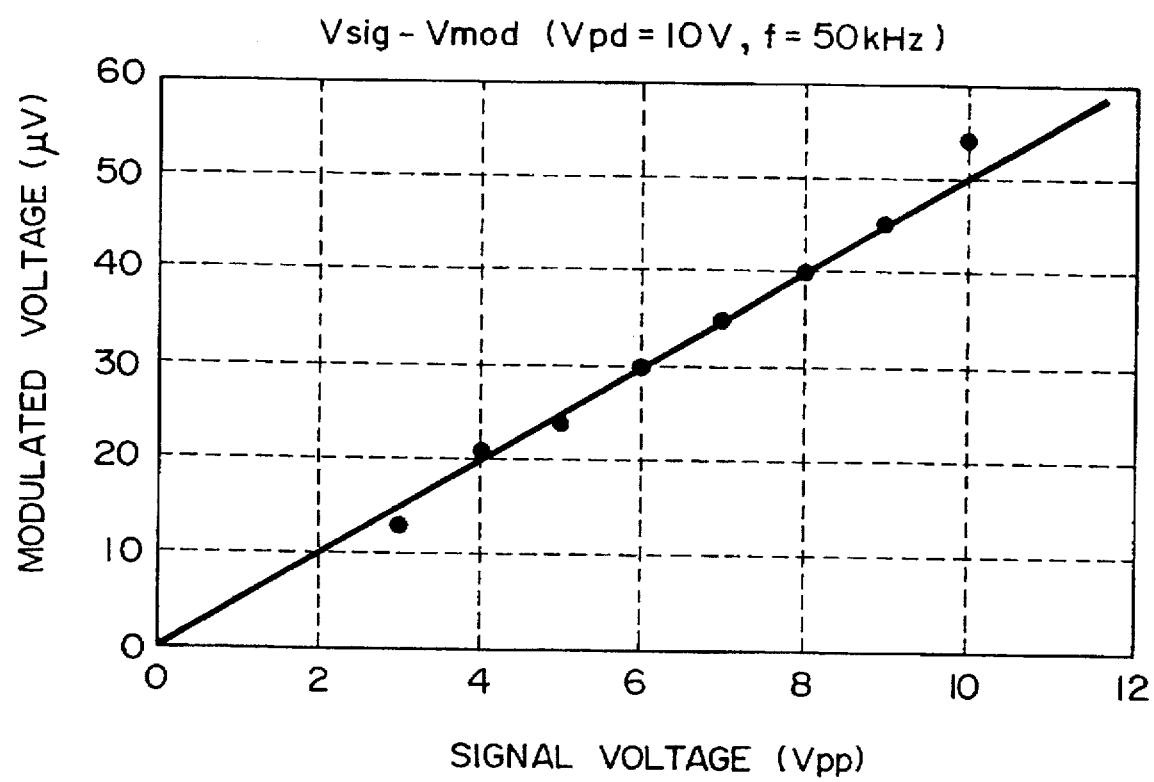
FIG. 12 is a graph showing the distribution of actually measured data of a modulated output with respect to the voltage amplitude of an electrical signal.

FIG. 12 shows the distribution of actually measured data of a modulated signal voltage $V_{mod}$ with respect to the amplitude voltage $V_{sig}$ of an electrical signal obtained when the electrode 75 is brought close to the measurement point 76a in a non-contact manner while the semiconductor laser 70 is CW-oscillating. Assume that a sine wave signal of a frequency of 50 kHz is applied to the circuit 76 to be measured. The modulated signal is detected by the lock-in amplifier 44. As can be seen from these actually measured data, the detected signal is proportional to the signal amplitude. As can be understood from the above description, an electrical signal applied to the circuit 76 to be measured can be measured if the electrode 75 is not brought into contact with the circuit 76 to be measured.

Figure 13:
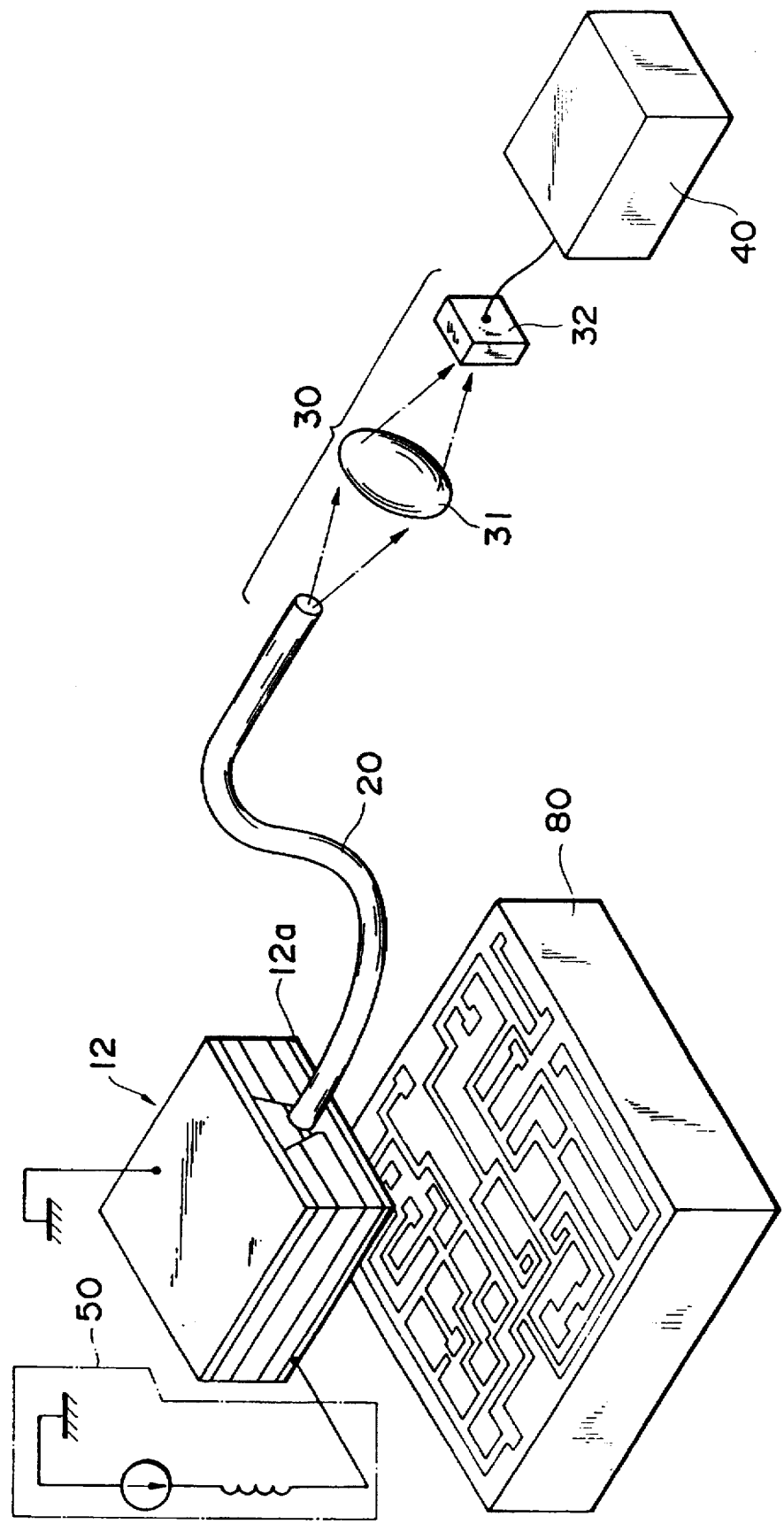
FIG. 13 is a perspective view showing an arrangement of a voltage detection apparatus according to the embodiment of the present invention.

A modification of this embodiment will be described below with reference to the perspective view in FIG. 13. In this modification, the lower-surface electrode 12a of the semiconductor laser 12 is used as a voltage detection electrode, thereby omitting the electrode 11. Output light from the semiconductor laser 12 is detected by the photodetector 30 via the optical fiber 20 adhered to the output end face of the semiconductor laser 12. Note that the semiconductor laser 12 and the optical fiber 20 may be arranged to be separated by a predetermined interval in place of the direct connection. In this case, a focusing lens for focusing the output light from the semiconductor laser 12 onto the optical fiber 20 is required.

Figure 14:
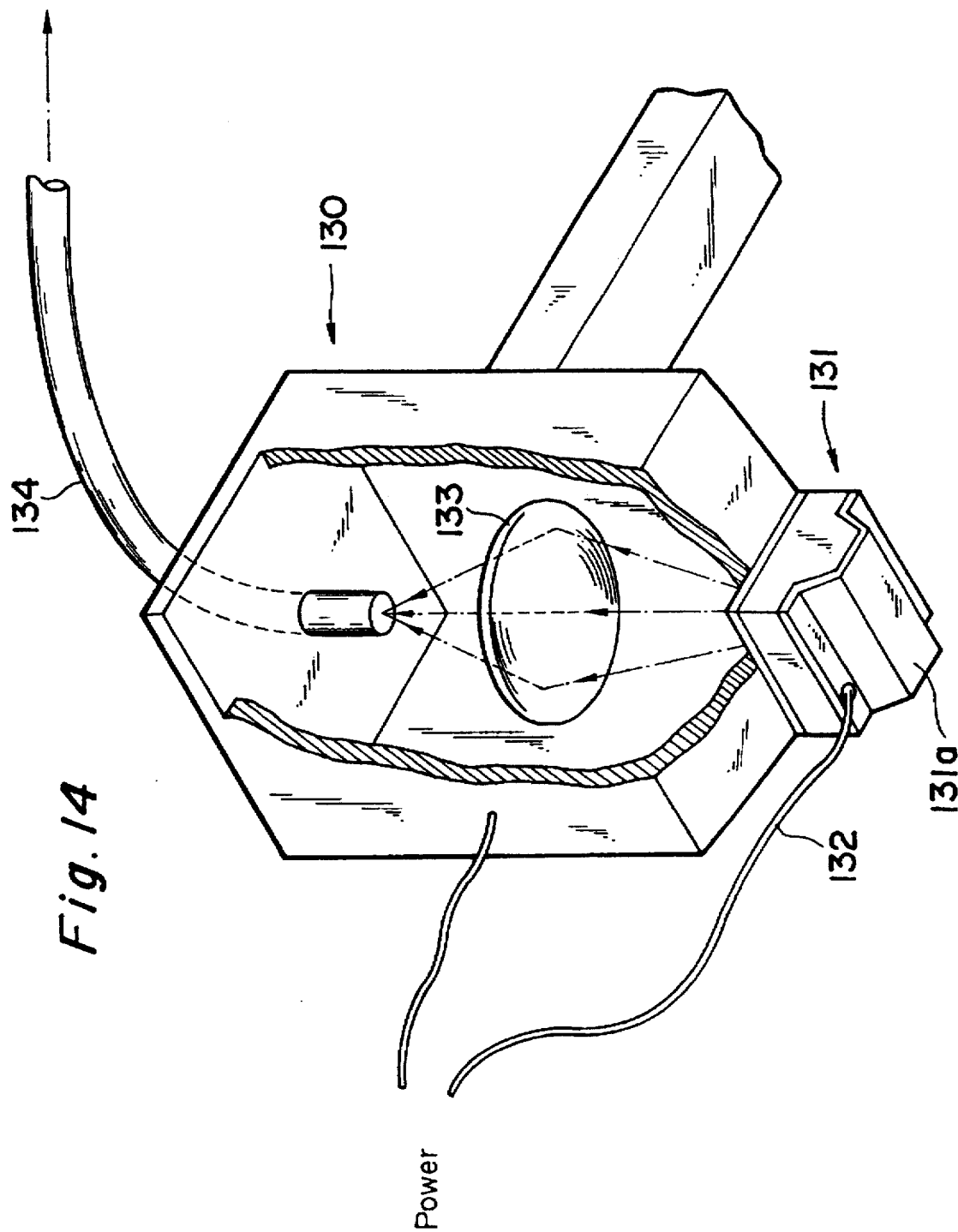
FIG. 14 is a perspective view showing an arrangement of a probe unit using a surface-emission laser.
Figure 15:
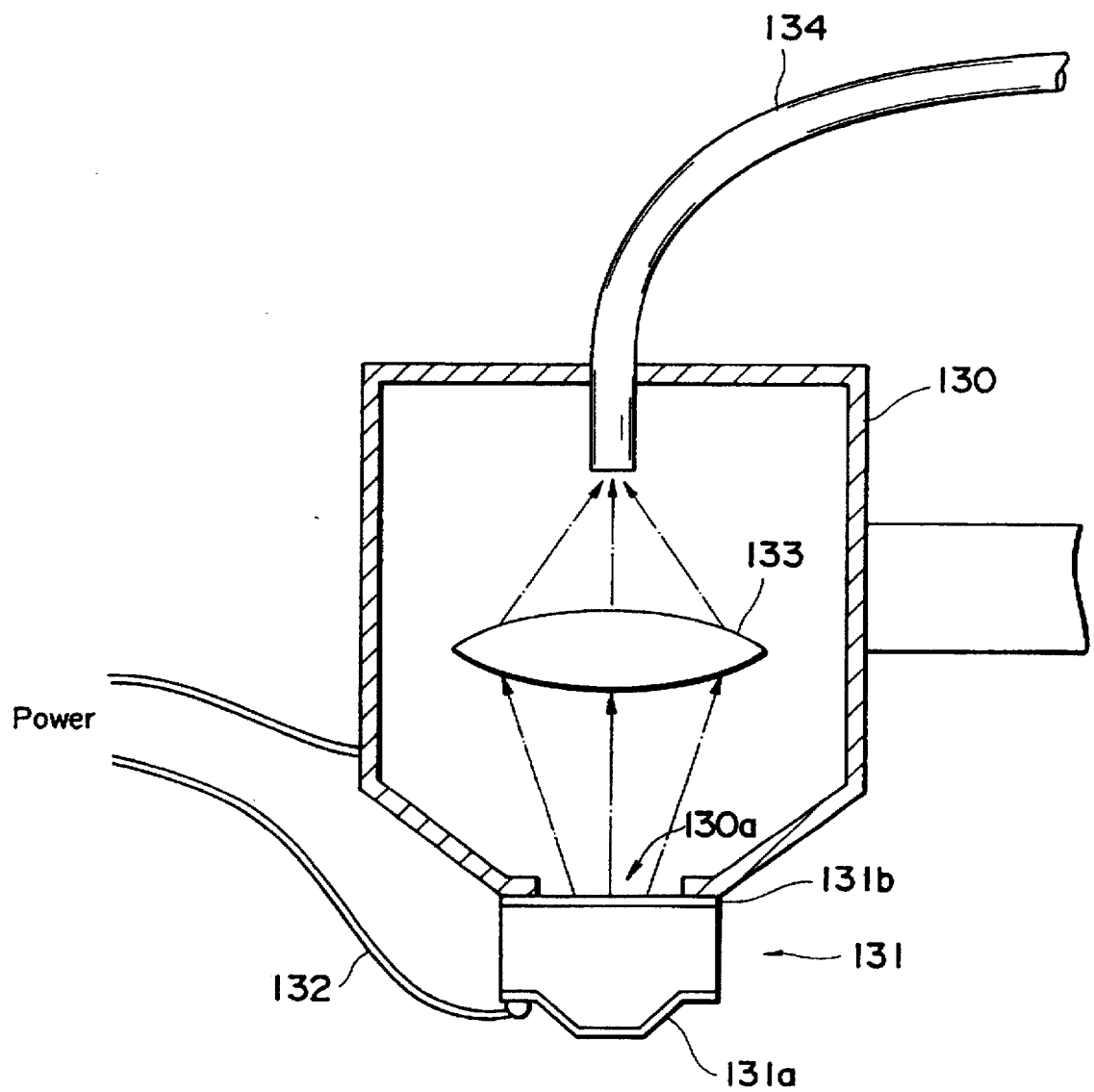
FIG. 15 is a sectional view showing the arrangement of the probe unit using the surface-emission laser.

FIG. 14 shows an arrangement of a probe unit 130 obtained when a surface-emission laser 131 is used in place of the semiconductor laser 12. An upper-surface electrode 131b of the surface-emission layer 131 is directly adhered to a housing 130. As shown in FIG. 15, an incident window 130a for receiving the output light from the surface-emission laser 131 is formed in the housing 130. Therefore, the housing 130 and the surface-emission laser 131 are connected to each other, so that the light output portion of the surface-emission laser 131 coincides with the incident window 130a. As the surface-emission laser 131, a ridge type one is used. For this reason, even when a bonding wire 132 is fixed to a lower-surface electrode 131a, it does not disturb measurements. The output light from the surface-emission laser is focused by a focusing lens 133 via the incident window 130a, and is supplied to an optical fiber 134.

Figure 16:
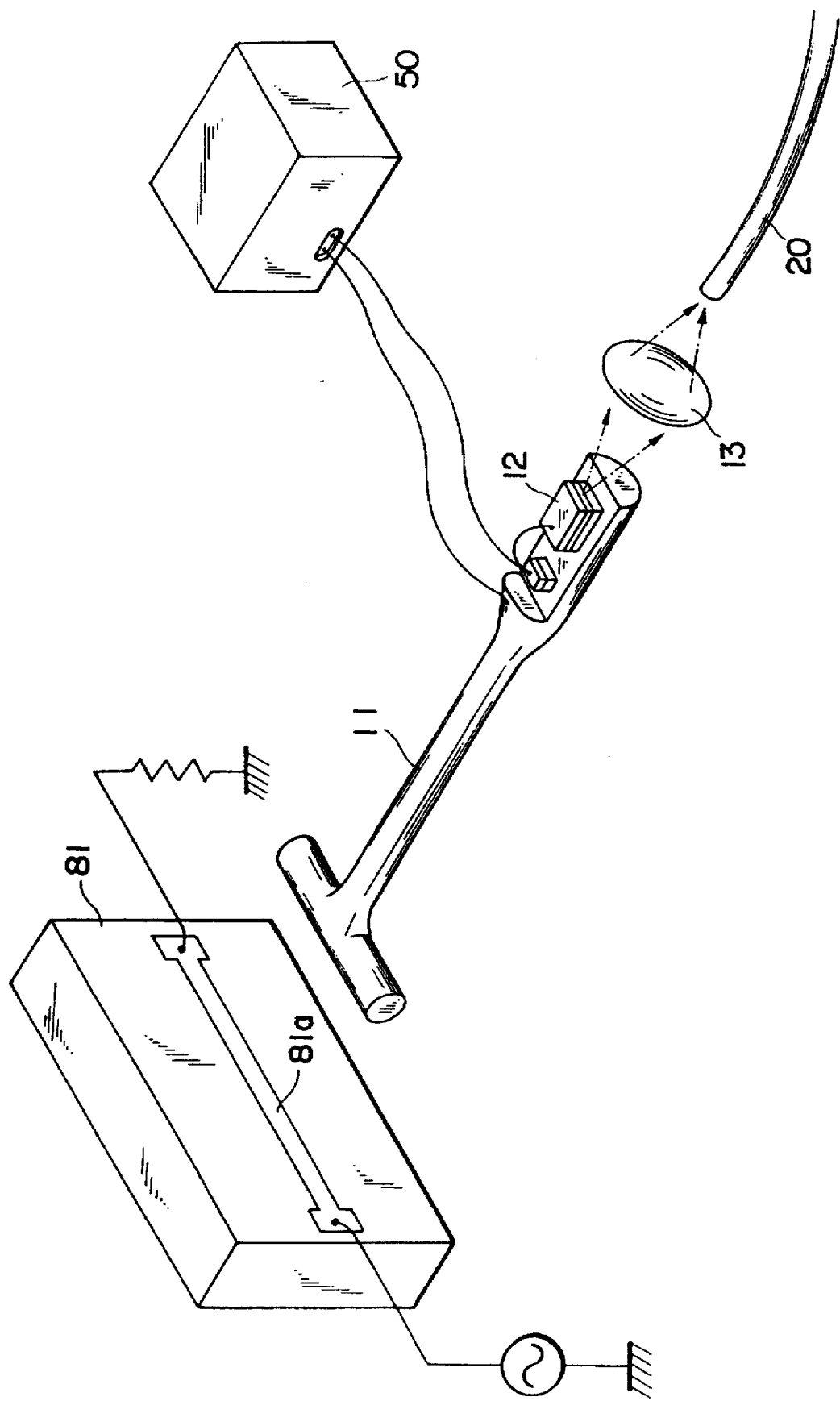
FIG. 16 is a perspective view showing a modification in which the electrode is formed to have a dipole antenna shape.

A modification of the electrode 11 will be described below with reference to FIGS. 16 and 17. FIG. 16 is a perspective view showing a modification in which the electrode 11 is formed to have a dipole antenna shape. The dipole antenna-shaped electrode 11 has high coupling efficiency when a measurement point 81a of a device 81 to be measured has a linear pattern. More specifically, when the electrode is brought close to the measurement point 81a in a non-contact manner with its distal end being directed to be parallel to the linear pattern of the measurement point 81a, the coupling efficiency becomes very high. In a circuit with crossing linear patterns, the distal end of the electrode can be aligned with a linear pattern to be measured, thus attaining a measurement with less crosstalk from the other linear pattern.

Figure 17:
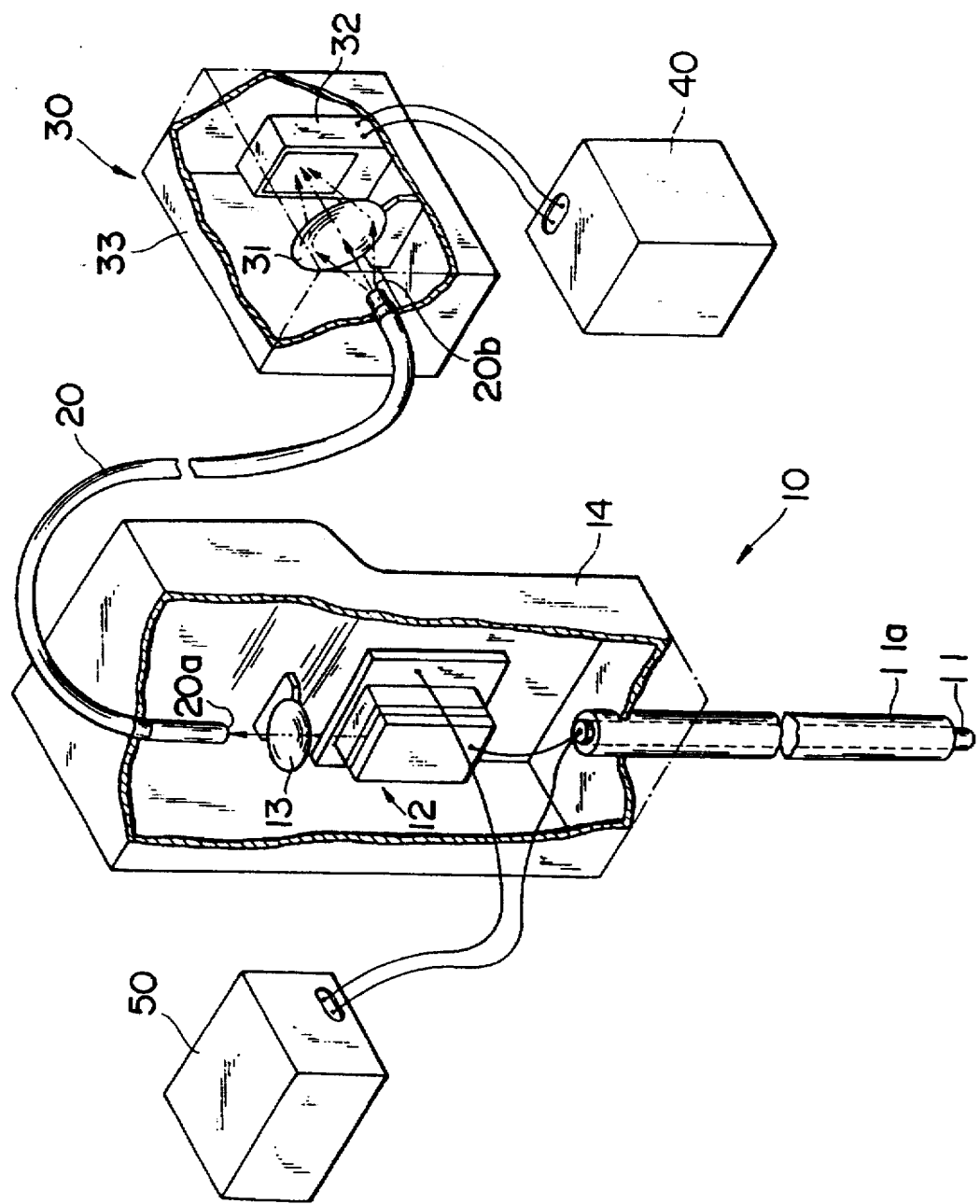
FIG. 17 is a perspective view showing a modification in which the electrode is formed to have a needle shape, and is covered with a non-conductive material such as a ceramic.

FIG. 17 is a perspective view showing a modification wherein the electrode 11 is formed to have a needle shape, and is covered with a non-conductive material 11a such as a ceramic. Since a high mechanical strength against bending can be assured by the non-conductive material 11a, a thin electrode 11 can be used. For this reason, an electric field of a very narrow portion on the surface of a device to be measured can be detected, and the spatial resolution can be improved.

Figure 18:
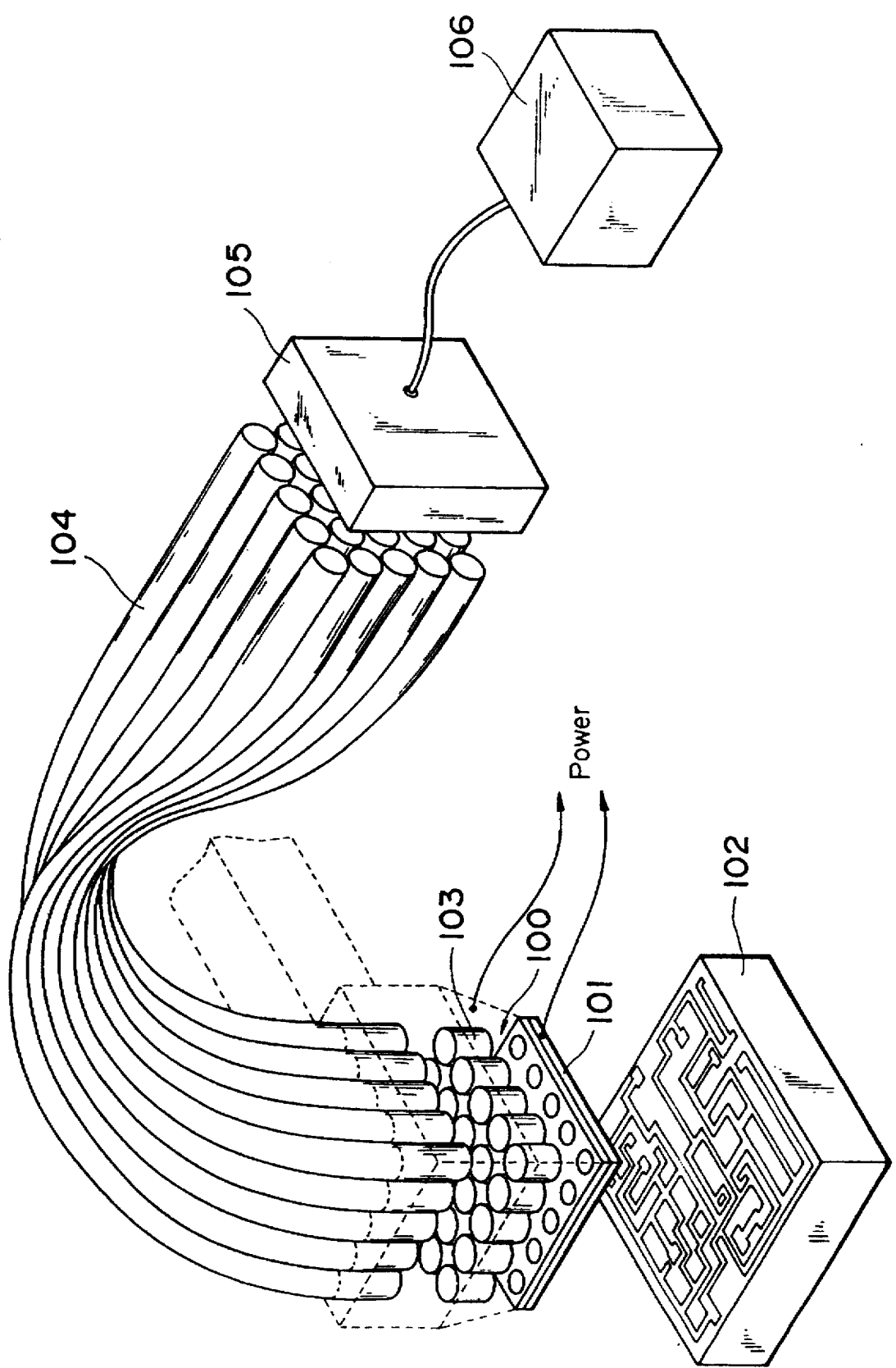
FIG. 18 is a perspective view showing a modification using a surface-emission semiconductor laser array.
Figure 19:
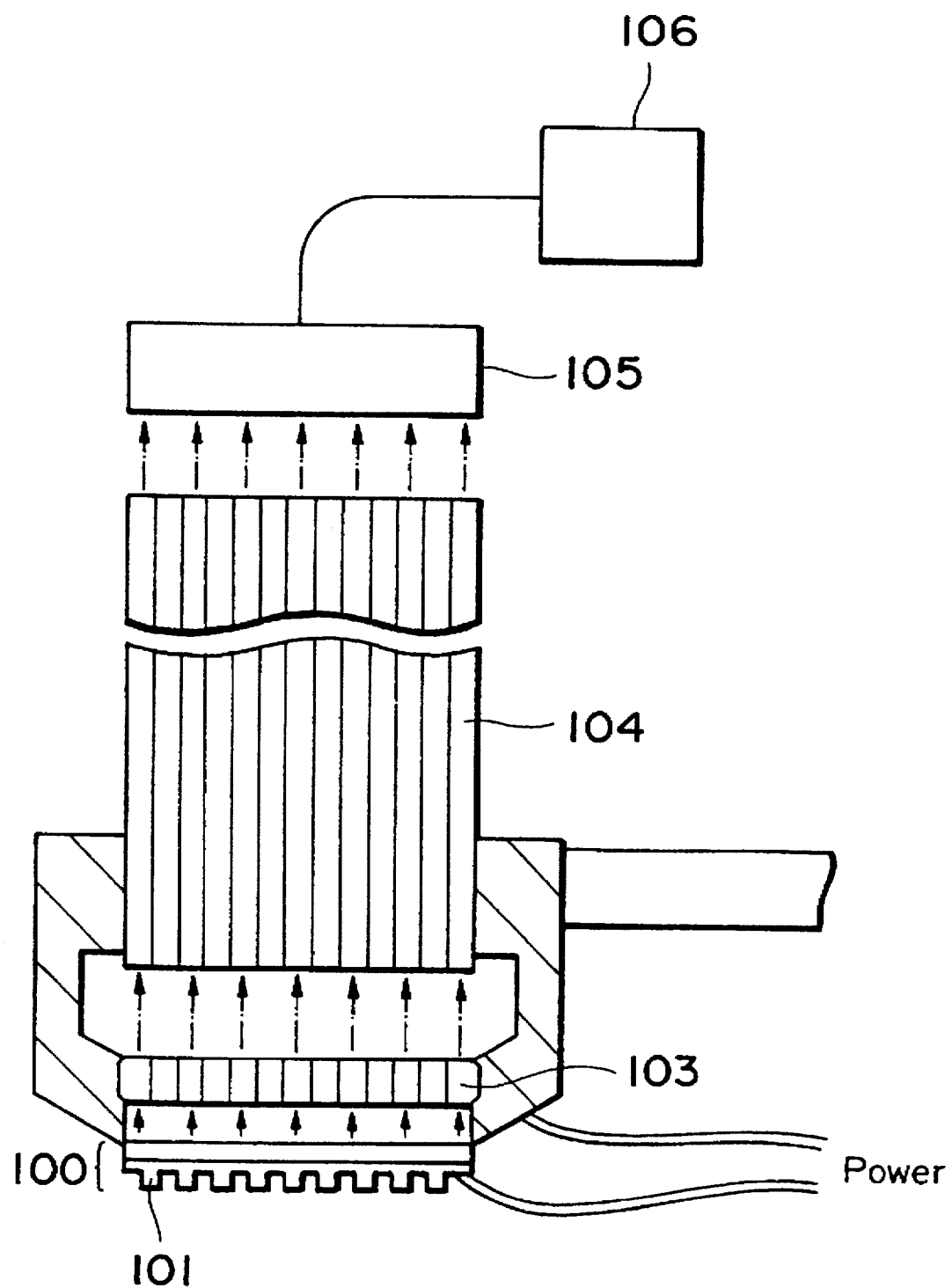
FIG. 19 is a sectional view showing the modification using the surface-emission semiconductor laser array.

FIG. 18 is a perspective view showing a modification in which a surface-emission semiconductor laser array 100 is used. FIG. 19 is a sectional view showing the structure of this modification. Since this modification adopts the semiconductor laser array 100, the surface of a device to be measured can be two-dimensionally measured. A plurality of electrodes 101 corresponding to semiconductor lasers are arranged on the lower surface of the semiconductor laser array 100. These electrodes 101 are applied with a voltage from a power source. When the electrodes 101 are brought close to an upper portion of a device 102 to be measured in a non-contact manner, the semiconductor lasers of the semiconductor laser array 100 modulate their output light beams by an electrical signal applied to the device 102 to be measured immediately therebelow. The modulated output light beams become incident on an optical fiber array 104 via a SELFOC lens 103, and are then guided to a photodetector 105. As the photodetector 105, for example, a photodiode array, CCDs, and the like are used. When detected signals from the photodetector 105 are processed by a signal processor 106, electrical signals at a plurality of points can be simultaneously measured.

FIG. 20 is a perspective view showing an application in which this embodiment is applied to an IC inspection apparatus. In this application, an IC circuit board 110 is placed on an upper stage 112 of a base plate 111, and the voltage applied to an IC circuit 110 formed on the IC circuit board 110 is measured by a probe unit 114 fixed above the stage 112. The IC circuit board 110 and the probe unit 114 are aligned in the longitudinal and widthwise directions by moving the upper stage 112 and a lower stage 113 in the right-and-left directions. The IC circuit board 110 and the probe unit 114 are aligned in the vertical direction by moving a movable stage 116 provided to a probe support portion 115 in the vertical direction. The voltage applied to the IC circuit 110 measured by the probe unit 114 is transmitted through an optical fiber 117 as signal light. This signal light is detected by a photodetector 118, and the detected signal is processed by a signal processor 119.

In this embodiment, the semiconductor laser 12 is used as a light source. However, the present invention is not limited to the semiconductor laser. For example, a light-emitting diode may be used.

The optical fiber 20 is not an indispensable component of the present invention. For example, the photodetector 30 may be arranged on the optical axis of the focusing lens 13, and the probe unit 10 and the photodetector 30 may be integrated.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A voltage detection apparatus, comprising:

detection means for detecting a strength of an electric field by a voltage applied to a surface of a device to be measured and modulating an electric signal, based on the strength of said electric field;

light-emitting means for modulating output light, based on said electric signal modulated by said detection means;

extraction means for extracting a signal component of said output light from said light-emitting means; and a constant current source for supplying a bias current, wherein said light-emitting means comprises a semiconductor laser which receives said bias current from said constant current source to inductively radiate said output light, and modulates said output light by superposing said signal detected by said detection means on said bias current;

wherein said detection means comprises a rod-shaped metal electrode with a sharp distal end, which electrode has a flat surface on a proximal end portion thereof, said semiconductor laser is placed on the flat surface to perform electric contact between the flat surface and a lower electrode thereof, said detection means is connected to one electrode of said constant current source, and an upper electrode of said semiconductor is connected to the other electrode of said constant current source.

2. A voltage detection apparatus, comprising:

detection means for detecting a strength of an electric field by a voltage applied to a surface of a device to be measured and modulating an electric signal, based on the strength of said electric field;

light-emitting means for modulating output light, based on said electric signal modulated by said detection means;

extraction means for extracting a signal component of said output light from said light-emitting means; and a constant current source for supplying a bias current, wherein said light-emitting means comprises a semiconductor laser which receives said bias current from said constant current source to inductively radiate said output light, and modulates said output light by superposing said signal detected by said detection means on said bias current;

wherein said detection means comprises a needle-shaped metal electrode inserted in a hollow tube consisting of a non-conductive material, said metal electrode of said detection means and an upper electrode of said semiconductor laser are connected to one electrode of said constant current source, and a lower electrode of said semiconductor laser is connected to the other electrode of said constant current source.

3. A voltage detection apparatus, comprising:

detection means for detecting a strength of an electric field by a voltage applied to a surface of a device to be measured and modulating an electric signal, based on the strength of said electric field;

light-emitting means for modulating output light, based on said electric signal modulated by said detection means;

extraction means for extracting a signal component of said output light from said light-emitting means; and a constant current source for supplying a bias current, wherein said light-emitting means comprises a semiconductor laser which receives said bias current from said constant current source to inductively radiate said output light, and modulates said output light by superposing said signal detected by said detection means on said bias current;

wherein said detection means comprises a dipole-shaped metal electrode, said detection means and an upper electrode of said semiconductor laser are connected to one electrode of said constant current source, and a lower electrode of said semiconductor laser is connected to the other electrode of said constant current source.

4. A voltage detection apparatus, comprising:

detection means for detecting a strength of an electric field generated by a voltage applied to a surface of a device to be measured and modulating an electric signal, based on the strength of said electric field;

light-emitting means for modulating output light, based on said electric signal modulated by said detection means;

extraction means for extracting a signal component of said output light from said light-emitting means placing means for placing the device to be measured; and three-dimensional position adjustment means for adjusting a relative positional relationship between the device to be measured and said detection means.

5. A voltage detection apparatus comprising:

a semiconductor laser for detecting a strength of an electric field generated in a space by a voltage applied to a surface of a device to be measured by bringing a lower electrode thereof close to a surface of the device to be measured, and modulating output light by the detected signal;

a constant current source for supplying a bias current to said semiconductor laser;

extraction means for extracting a signal component of the output light from said semiconductor laser; and light-transmission means for guiding the output light from said semiconductor laser to said extraction means.

6. An apparatus according to claim 5, wherein said semiconductor laser comprises a surface-emission laser, said apparatus further comprises optical means for focusing the output light from said semiconductor laser to an input terminal of said light-transmission means, and a housing for storing said optical means, said housing has an incident window for receiving the output light from said semiconductor laser, said semiconductor laser is fixed to said housing to close the incident window with a light exit surface thereof, and said light-transmission means is inserted in said housing, so that the input terminal is arranged on an optical axis of the output light from said semiconductor laser.

7. An apparatus according to claim 5, wherein said light-transmission means comprises an optical fiber.

8. An apparatus according to claim 5 further comprising:

placing means for placing the device to be measured; and three-dimensional position adjustment means for adjusting a relative positional relationship between the device to be measured and said semiconductor laser.

9. A voltage detection apparatus comprising:

a plurality of two-dimensionally arranged detection means for detecting strengths of an electric field generated in a space by a voltage applied to a surface of a device to be measured;

a semiconductor laser array, consisting of a plurality of semiconductor lasers corresponding to said plurality of detection electrodes, for modulating output light beams by superposing detected signals obtained from said plurality of detection electrodes on a bias current which is supplied to inductively radiate the output light beams;

a constant current source for supplying the bias current to said semiconductor laser array;

extraction means for extracting signal components of the output light beams from said semiconductor lasers of said semiconductor laser array; and light-transmission means for guiding the output light beams from said semiconductor laser array to said extraction means.

10. An apparatus according to claim 9, wherein said light-transmission means comprises an optical fiber array.

11. An apparatus according to claim 9 further comprising:

placing means for placing the device to be measured; and three-dimensional position adjustment means for adjusting a relative positional relationship between the device to be measured and said semiconductor laser array.

* * * * *